US011276781B2

(12) United States Patent
Wu et al.

(10) Patent No.: US 11,276,781 B2
(45) Date of Patent: Mar. 15, 2022

(54) BOTTOM SOURCE/DRAIN FOR FIN FIELD EFFECT TRANSISTORS

(71) Applicant: INTERNATIONAL BUSINESS MACHINES CORPORATION, Armonk, NY (US)

(72) Inventors: Heng Wu, Guilderland, NY (US); Shogo Mochizuki, Clifton Park, NY (US); Gen Tsutsui, Glenmont, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 49 days.

(21) Appl. No.: 16/849,101

(22) Filed: Apr. 15, 2020

(65) Prior Publication Data
US 2021/0328051 A1 Oct. 21, 2021

(51) Int. Cl.
| H01L 29/78 | (2006.01) |
| H01L 29/66 | (2006.01) |
| H01L 29/417 | (2006.01) |
| H01L 21/8238 | (2006.01) |
| H01L 21/8234 | (2006.01) |
| H01L 27/24 | (2006.01) |

(52) U.S. Cl.
CPC .... *H01L 29/785* (2013.01); *H01L 21/823487* (2013.01); *H01L 21/823885* (2013.01); *H01L 27/2454* (2013.01); *H01L 29/41791* (2013.01); *H01L 29/66795* (2013.01); *H01L 29/7827* (2013.01)

(58) Field of Classification Search
CPC .......................... H01L 29/7827; H01L 27/2454
See application file for complete search history.

(56) References Cited

U.S. PATENT DOCUMENTS

| 5,612,563 | A | 3/1997 | Fitch et al. |
| 6,417,099 | B1 | 7/2002 | Tsai et al. |
| 9,287,362 | B1 | 3/2016 | Basu et al. |
| 9,406,690 | B2 | 8/2016 | Pang et al. |
| 9,799,765 | B1 | 10/2017 | Bergendahl et al. |
| 9,954,102 | B1* | 4/2018 | Mochizuki .......... H01L 29/0847 |
| 9,960,272 | B1* | 5/2018 | Bao ..................... H01L 29/0649 |
| 10,079,299 | B2 | 9/2018 | Gluschenkov et al. |
| 2013/0001701 | A1 | 1/2013 | Christensen et al. |
| 2017/0358497 | A1 | 12/2017 | Cheng et al. |
| 2018/0342614 | A1 | 11/2018 | Bergendahl et al. |

* cited by examiner

*Primary Examiner* — Farun Lu
(74) *Attorney, Agent, or Firm* — Tutunjian & Bitetto, P.C.; Jeffrey S. LaBaw

(57) ABSTRACT

A method of forming a vertical transport fin field effect transistor device is provided. The method includes forming vertical fins on a substrate, depositing a protective liner on the sidewalls of the vertical fins, and removing a portion of the substrate to form a support pillar beneath at least one of the vertical fins. The method further includes etching a cavity in the support pillar of the at least one of the vertical fins, and removing an additional portion of the substrate to form a plinth beneath the support pillar of the vertical fin. The method further includes growing a bottom source/drain layer on the substrate adjacent to the plinth, and forming a diffusion plug in the cavity, wherein the diffusion plug is configured to block diffusion of dopants from the bottom source/drain layer above a necked region in the support pillar.

19 Claims, 10 Drawing Sheets

BOTTOM SOURCE/DRAIN FOR FIN FIELD EFFECT TRANSISTORS

BACKGROUND

The present invention generally relates to fabrication of bottom source/drains, and more particularly to bottom source/drains for vertical transport fin field effect transistor (VTFinFET) devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming a vertical transport fin field effect transistor device is provided. The method includes forming one or more vertical fins on a substrate. The method further includes depositing a protective liner on the sidewalls of at least one of the one or more vertical fins, and removing a portion of the substrate to form a support pillar beneath the at least one of the one or more vertical fins. The method further includes etching a cavity in the support pillar of the at least one of the one or more vertical fins, and removing an additional portion of the substrate to form a plinth beneath the support pillar of the at least one of the one or more vertical fins. The method further includes growing a bottom source/drain layer on the substrate adjacent to the plinth, and forming a diffusion plug in the cavity, wherein the diffusion plug is configured to block diffusion of dopants from the bottom source/drain layer above a necked region in the support pillar.

In accordance with another embodiment of the present invention, a method of forming a vertical transport fin field effect transistor device is provided. The method includes forming one or more vertical fins on a substrate. The method further includes depositing a protective liner on the sidewalls of at least one of the one or more vertical fins, and removing a portion of the substrate to form a support pillar beneath the at least one of the one or more vertical fins. The method further includes etching a cavity in the support pillar of the at least one of the one or more vertical fins, and removing an additional portion of the substrate to form a plinth beneath the support pillar of the at least one of the one or more vertical fins. The method further includes growing a bottom source/drain layer on the substrate adjacent to the plinth, and forming a diffusion barrier layer on the bottom source/drain layer that fills in the cavity to block diffusion of dopants from the bottom source/drain layer above a necked region in the support pillar.

In accordance with yet another embodiment of the present invention, a vertical transport fin field effect transistor device is provided. The device includes one or more vertical fins on a substrate. The device further includes a support pillar beneath at least one of the one or more vertical fins, and a cavity in the support pillar of the at least one of the one or more vertical fins. The device further includes a plinth beneath the support pillar of the at least one of the one or more vertical fins, and a bottom source/drain layer on the substrate adjacent to the plinth. The device further includes an extension region in the plinth and the support pillar that extends up to a lower facet of the cavity, and a diffusion barrier layer on the bottom source/drain layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
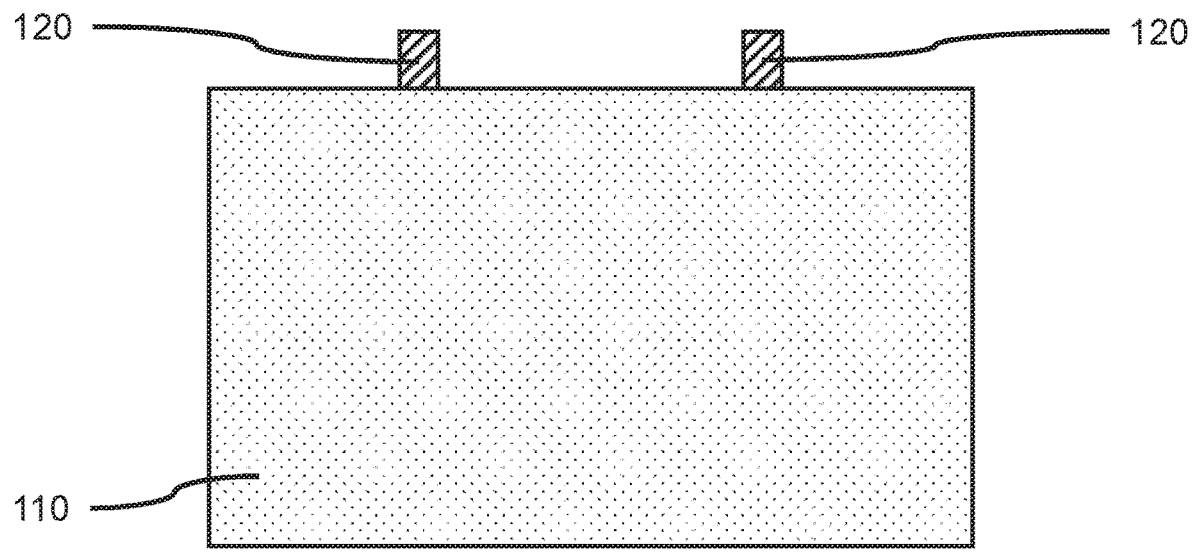
FIG. 1 is a cross-sectional side view showing fin templates on a substrate, in accordance with an embodiment of the present invention.

Embodiments of the present invention provide vertical transport fin field effect transistor (VT FinFET) devices with a sigma shaped cavity and bottom source/drain closer to the center of the fin region. The arrangement of the bottom S/D structure can sustain a high thermal drive temperature to form the extension regions below the fin channel, which can improve the bottom source/drain resistance. A diffusion barrier can control dopant diffusion into extension regions of the vertical fin under the bottom spacer, while having maximum doping in the bottom source/drain regions.

Embodiments of the present invention provide a method of fabricating a vertical transport fin field effect transistor devices with a diffusion barrier can control dopant diffusion into extension regions of the vertical fin under the bottom spacer and extension regions under the bottom spacer. A two step etch can be used, where a diffusion plug can be formed in a sigma cavity below the fin channel, and a second etch can form a trench for a bottom source/drain layer. A diffusion barrier layer can be formed on the bottom source/drain layer. The diffusion plugs can be placed close to the fin channel for the bottom source/drain.

Embodiments of the present invention provide a diffusion plug and diffusion barrier layer made of silicon (Si) doped with phosphorus (P) and containing carbon (SiC:P) or silicon doped with arsenic and containing carbon (SiC:As) for stopping diffusion of n-type dopants. In various embodiments, the carbon content of the layer can be in a range of about 1 atomic percent (at. %) to about 2 at. %, although other concentrations are also contemplated.

Embodiments of the present invention provide a diffusion plug and diffusion barrier layer made of silicon (Si) doped with boron (B) and containing carbon (SiC:B), high germanium concentration silicon-germanium doped with boron (SiGe:B) or silicon-germanium (SiGe) doped with boron (B) and containing carbon (SiGeC:B) for stopping diffusion of p-type dopants. In various embodiments, the carbon content of the layer can be in a range of about 1 atomic percent (at. %) to about 2 at. %, although other concentrations are also contemplated. In various embodiments, a high germanium concentration is a germanium concentration that is greater than the germanium concentration of the associated silicon-germanium source/drain. In various embodiments, a high germanium concentration is in a range of about 55 atomic percent (at. %) to about 75 at. %, or about 60 at. % to about 70 at. %, or about 65 at. %, although other concentrations are also contemplated.

Exemplary applications/uses to which the present invention can be applied include, but are not limited to: logic devices (e.g., NAND gates, NOR gates, XOR gates, etc.), memory devices (e.g., static random access memory (SRAM), dynamic random access memory (DRAM)), application specific integrated circuits (ASICs), microcontrollers, CMOS BIOS chips, etc.

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, a cross-sectional side view of fin templates on a substrate is shown, in accordance with an embodiment of the present invention.

In one or more embodiments, the substrate 110 can be a semiconductor substrate (e.g., a monolithic semiconductor wafer) or a semiconductor-on-insulator (SeOI) substrate, including, an active semiconductor surface layer, a buried insulator layer, and a carrier or support layer. One or more semiconductor devices can be formed on or in the substrate 110.

In various embodiments, the substrate 110 can include a semiconductor material, including, but not limited to, a group IV semiconductor (e.g., silicon (Si), germanium (Ge), a compound IV-IV semiconductor (e.g., silicon-germanium (SiGe), silicon carbide (SiC), a compound III-V semiconductor (e.g., gallium-arsenide (GaAs), gallium nitride (GaN), indium phosphide (InP), Indium gallium nitride (InGaN), aluminum gallium phosphide (AlGaP), etc.), a compound II-VI semiconductor (e.g., zinc selenide (ZnSe), zinc oxide (ZnO), cadmium sulfide (CdS), cadmium telluride (CdTe), etc.), and combinations thereof.

In one or more embodiments, fin templates 120 can be formed on the substrate 110, where the fin templates 120 can be formed by lithographic techniques and etching. The fin templates 120 can be a hardmask material for forming vertical fins from the substrate, for example, titanium nitride (TiN), silicon oxide (SiO), silicon nitride (SiN), silicon oxynitride (SiON), silicon boro carbonitride (SiBCN), and combinations thereof.

Figure 2:
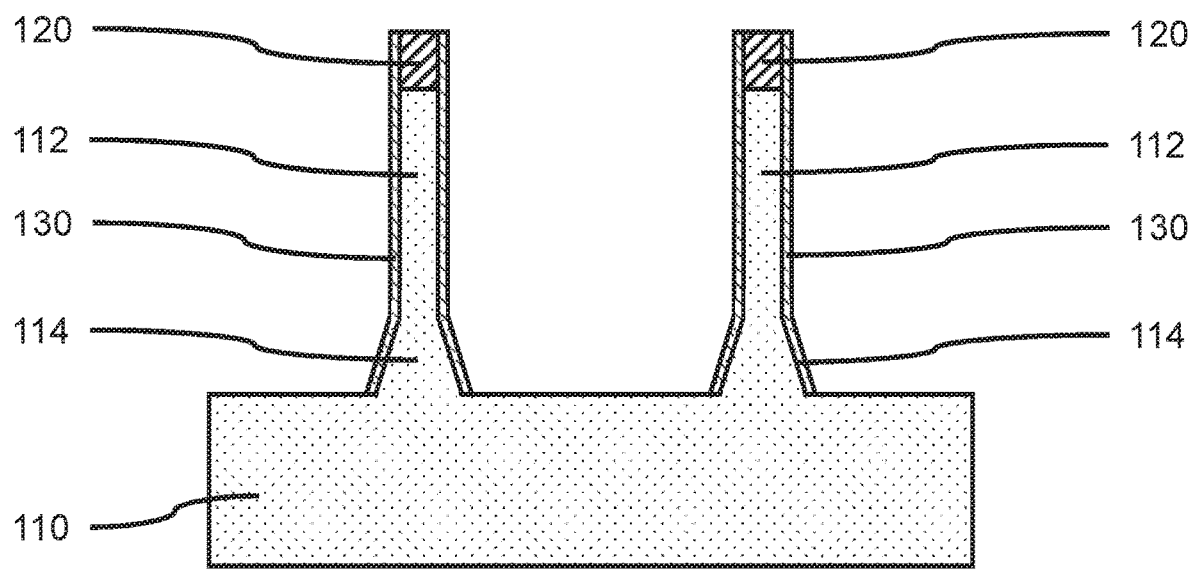
FIG. 2 is a cross-sectional side view showing a plurality of vertical fins on the substrate below the fin templates, and a protective liner on the vertical fins and fin templates, in accordance with an embodiment of the present invention.

FIG. 2 is a cross-sectional side view showing a plurality of vertical fins on the substrate below the fin templates, and a protective liner on the vertical fins and fin templates, in accordance with an embodiment of the present invention.

In one or more embodiments, a plurality of vertical fins 112 can be formed on a substrate 110, where the vertical fins can be formed by lithographic techniques and etching using fin templates 120. In various embodiments, the vertical fins 112 can be formed from the substrate 110 by a sidewall image transfer process, including, but not limited to, self-aligned double patterning (SADP), self-aligned triple patterning (SATP), and self-aligned quadruple patterning (SAQP). In various embodiments, the vertical fins 112 can be formed by masked and/or direct write lithographic processes, for example, extreme ultraviolet lithography (EUV), e-beam lithography, laser lithography, ion beam lithography, and combinations thereof. The vertical fins 112 can be formed from a vertical fin layer formed on the substrate, for example, by epitaxial growth and/or layer transfer methods (e.g., Epitaxial Liftoff Processes (ELO), Smart-Cut®, etc.). A fin template 120 can be formed on each of the vertical fins as part of the lithographic process and etching.

In various embodiments, the vertical fins 112 can have a width in a range of about 4 nanometers (nm) to about 15 nm, or about 5 nm to about 10 nm, or about 6 nm to about 8 nm, although other widths are also contemplated. An upper portion of the vertical fin can form a fin channel of a VT FinFET. A lower portion of the vertical fins 112 can flare outward, where the width can increase towards the substrate 110. In various embodiments, the vertical fins 112 can have a width at the base in a range of about 7 nm to about 20 nm, or about 9 nm to about 15 nm, or about 7 nm to about 10 nm, although other widths are also contemplated.

In various embodiments, the vertical fins 112 can have a height in a range of about 20 nm to about 100 nm, or about 25 nm to about 80 nm, or about 30 nm to about 60 nm, although other heights are also contemplated.

In one or more embodiments, a protective liner 130 can be formed on the fin templates, vertical fins 112, and substrate surface, where the protective liner 130 can be formed by a conformal deposition, including, but not limited to, atomic layer deposition (ALD), plasma enhanced ALD (PEALD), and combinations thereof. A portion of the protective liner 130 on the surface of the substrate 110 and top surface of the fin templates 120 can be removed, for example, using a selective, directional etch (e.g. reactive ion etch (RIE)) leaving a portion of the protective liner 130 on the sidewalls and lower flared portion 114 of the vertical fins 112. The protective liner 130 can protect the vertical fins 112 and lowered flared portion 114 of the vertical fins 112 during subsequent etching processes, and prevent epitaxial growth on the covered surfaces.

In various embodiments, the protective liner 130 can be a dielectric material, including, but not limited to, silicon oxide (SiO), silicon nitride (SiN), silicon oxynitride (SiON), silicon boro carbonitride (SiBCN), and combinations thereof.

In various embodiments, the protective liner 130 can have a thickness in a range of about 2 nanometers (nm) to about 6 nm, or about 3 nm to about 4 nm, although other thicknesses are also contemplated. In various embodiments, the protective liner 130 can have a thickness greater than about 2 nm to avoid penetration through the protective liner 130.

Figure 3:
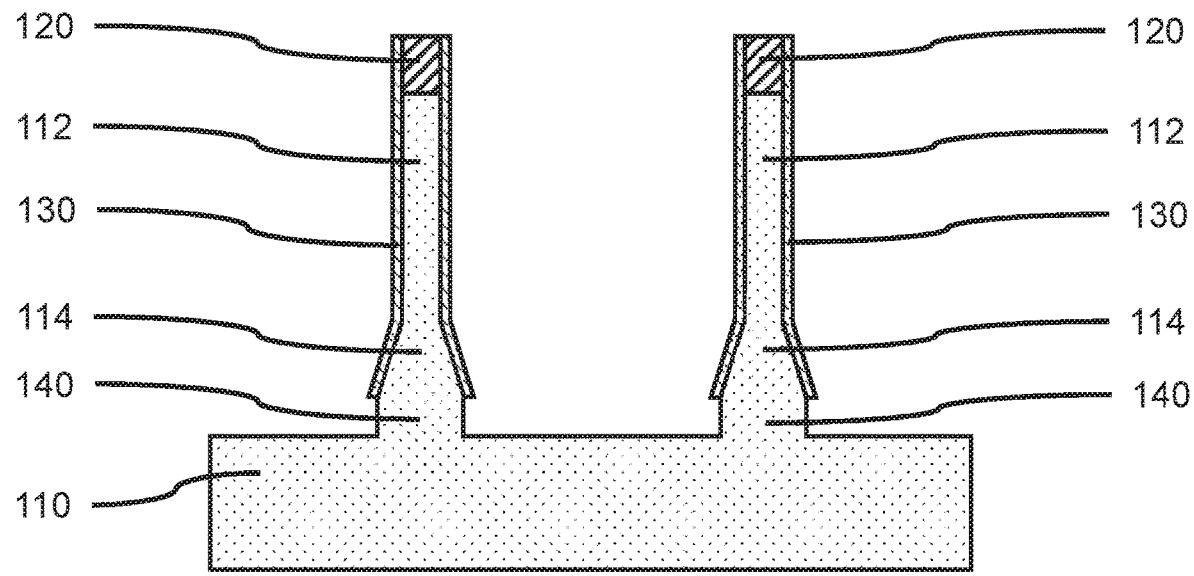
FIG. 3 is a cross-sectional side view showing a support column formed beneath each of the plurality of vertical fins, in accordance with an embodiment of the present invention.

FIG. 3 is a cross-sectional side view showing a support column formed beneath each of the plurality of vertical fins, in accordance with an embodiment of the present invention.

In one or more embodiments, a portion of the substrate 110 can be removed using a selective directional etch, for example, a reactive ion etch (RIE), using the fin templates 120 and protective liner 130 on the vertical fins 112 as a mask. Removal of the portion of the substrate 110 can form a support column 140 beneath the flared portion 114 of each of the vertical fins 112.

In various embodiments, the support column 140 can have a height between the top surface of the substrate 110 and bottom edge of the protective liner 130 on the flared portion 114 in a range of about 3 nm to about 10 nm, or about 4 nm to about 7 nm, or about 5 nm, although other heights are also contemplated.

Figure 4:
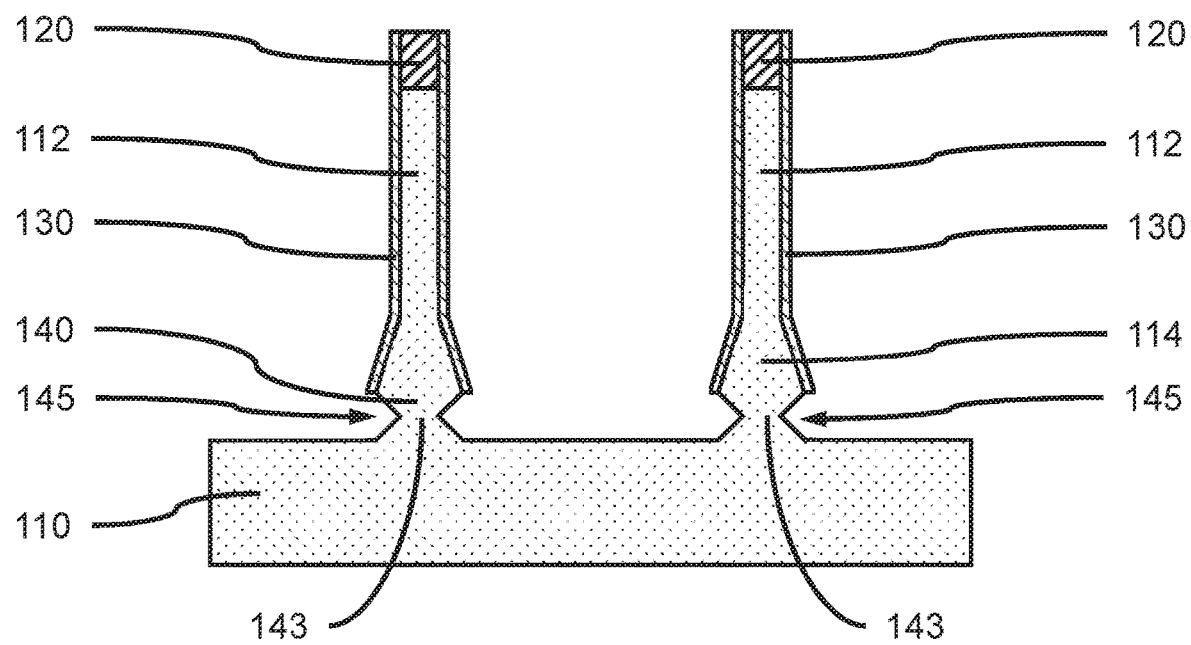
FIG. 4 is a cross-sectional side view showing cavities formed in each support column and removal of an upper portion of the substrate surface, in accordance with an embodiment of the present invention.

FIG. 4 is a cross-sectional side view showing cavities formed in each support column and removal of an upper portion of the substrate surface, in accordance with an embodiment of the present invention.

In one or more embodiments, a cavity 145 can be formed in each support column 140, where the cavity 145 can be formed by a crystal plane selective etch to form angled or faceted surfaces. For example, potassium hydroxide can be used to selectively etch in the <100> crystal direction to produce [111] crystal surfaces. The selective crystal plane etching can produce triangular shaped cavities in the support column 140. The shape of the cavities 145 can taper the width of the support column 140 down from the bottom of the flared portion 114, and then flare out towards the base of the support column 140 forming a narrowed neck region 143. In various embodiments, the cavities can be formed around the perimeter of each support column 140, such that a cavity 145 wraps completely around the support column 140. A portion of the exposed substrate 110 can also be removed during etching of the cavities 145, wherein the height of the support column 140 may be increased by about 3 nm to about 10 nm, or about 4 nm to about 7 nm, or about 5 nm, depending on the size of the cavities being formed and the duration of the etch.

In various embodiments, the height of the support column 140 is sufficiently less than the width of the support column 140 to avoid the cavity from meeting at the middle or the narrowed neck region 143 become incapable of supporting the vertical fin 112.

Figure 5:
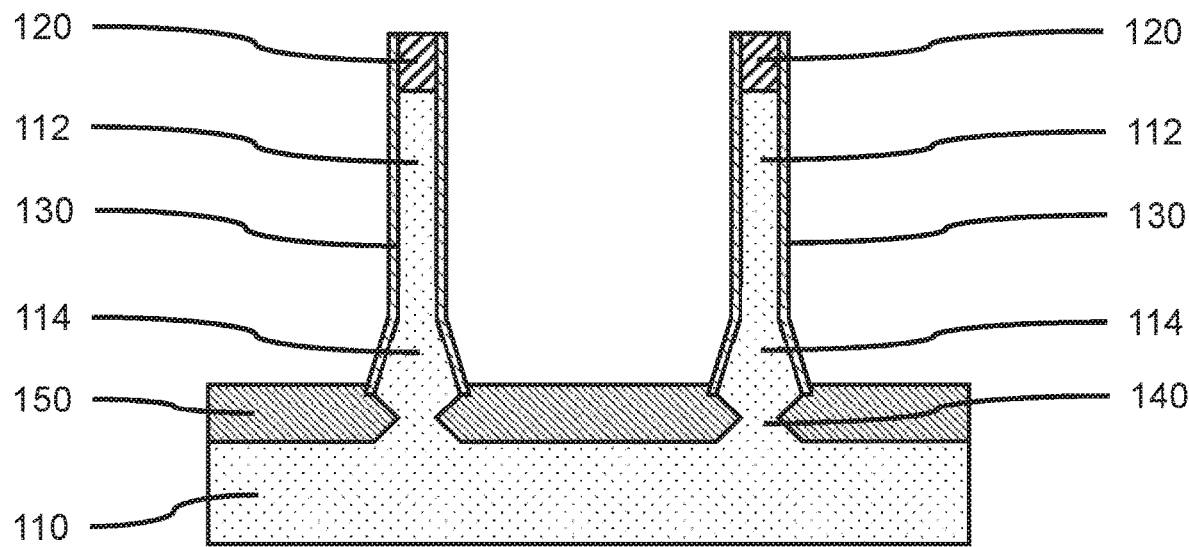
FIG. 5 is a cross-sectional side view showing a plug layer formed on the substrate and in the cavities, in accordance with an embodiment of the present invention.

FIG. 5 is a cross-sectional side view showing a plug layer formed on the substrate and in the cavities, in accordance with an embodiment of the present invention.

In one or more embodiments, a plug layer 150 can be formed on the substrate 110 and in the cavities 145, where the plug layer 150 can be formed by an epitaxial growth process. Epitaxial growth can be selectively from the exposed surfaces of the cavities 145 due to greater growth rates on the exposed crystal planes. The plug layer 150 can cover the substrate surfaces between the vertical fins 112.

In various embodiments, the plug layer 150 can be made of silicon (Si) doped with phosphorus (P) and containing carbon (SiC:P) or silicon doped with arsenic and containing carbon (SiC:As) for stopping diffusion of n-type dopants. In various embodiments, the plug layer 150 can be made of silicon (Si) doped with boron (B) and containing carbon (SiC:B), high germanium concentration silicon-germanium doped with boron (SiGe:B) or silicon-germanium (SiGe) doped with boron (B) and containing carbon (SiGeC:B) for stopping diffusion of p-type dopants. The dopants can be introduced in situ (i.e., during epitaxial growth of the plug layer). In various embodiments, the carbon content of the layer can be in a range of about 1 atomic percent (at. %) to about 2 at. %, although other concentrations are also contemplated. In various embodiments, a high germanium concentration is a germanium concentration that is greater than the germanium concentration of a silicon-germanium source/drain subsequently formed adjacent to an associate plinth and diffusion plugs. In various embodiments, a high germanium concentration is in a range of about 55 atomic percent (at. %) to about 75 at. %, or about 60 at. % to about 70 at. %, or about 65 at. %, although other concentrations are also contemplated.

In various embodiments, the plug layer 150 can have a thickness in a range of about 3 nm to about 10 nm, or about 4 nm to about 7 nm, or about 5 nm, although other thicknesses are also contemplated. The thickness of the plug layer 150 can be about the same as the height of the support column 140 and the cavity 145, so that the plug layer 150 fills in the cavity. The top surface of the plug layer 150 can extend above the top edge of the cavity 145 and the bottom edge of the protective liner 130 to cover the cavity 145.

Figure 6:
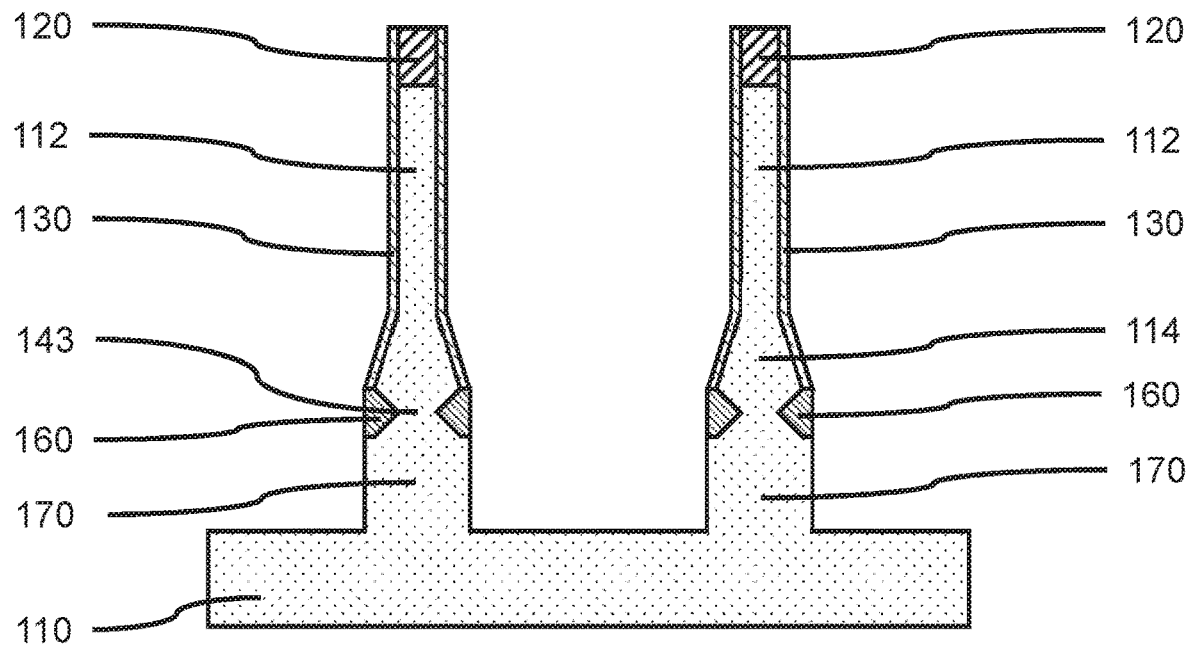
FIG. 6 is a cross-sectional side view showing exposed portions of the plug layer removed to form diffusion plugs in the cavities, and a plinth formed beneath each support column, in accordance with an embodiment of the present invention.

FIG. 6 is a cross-sectional side view showing exposed portions of the plug layer removed to form diffusion plugs in the cavities, and a plinth formed beneath each support column, in accordance with an embodiment of the present invention.

In one or more embodiments, exposed portions of the plug layer 150 can be removed to form diffusion plugs 160 in the cavities 145, where a selective directional etch (e.g., RIE) can be used to remove the exposed portions of the plug layer 150. The diffusion plugs 160 can fill the cavities 145 on opposite sides of the support column 140 at the narrowed neck region 143.

In one or more embodiments, a selective directional etch (e.g., RIE) can be used to remove an additional portion of the substrate 110 to form a plinth 170 below each of the support columns 140, where the selective directional etch (e.g., RIE) can use the fin templates 120 and protective liner 130 on the vertical fins 112 as a mask. The plinth(s) 170 can be, for example, rectangular or square. The plinths 170 can have a width about equal to the width of the overlying support column 140.

In various embodiments, the plinth 170 can have a height between the top surface of the substrate 110 and bottom edge of the diffusion plug 160 in a range of about 10 nm to about 40 nm, or about 10 nm to about 30 nm, or about 15 nm to about 25 nm, although other heights are also contemplated. The height of the plinth can provide space for a subsequently formed bottom source/drain layer.

Figure 7:
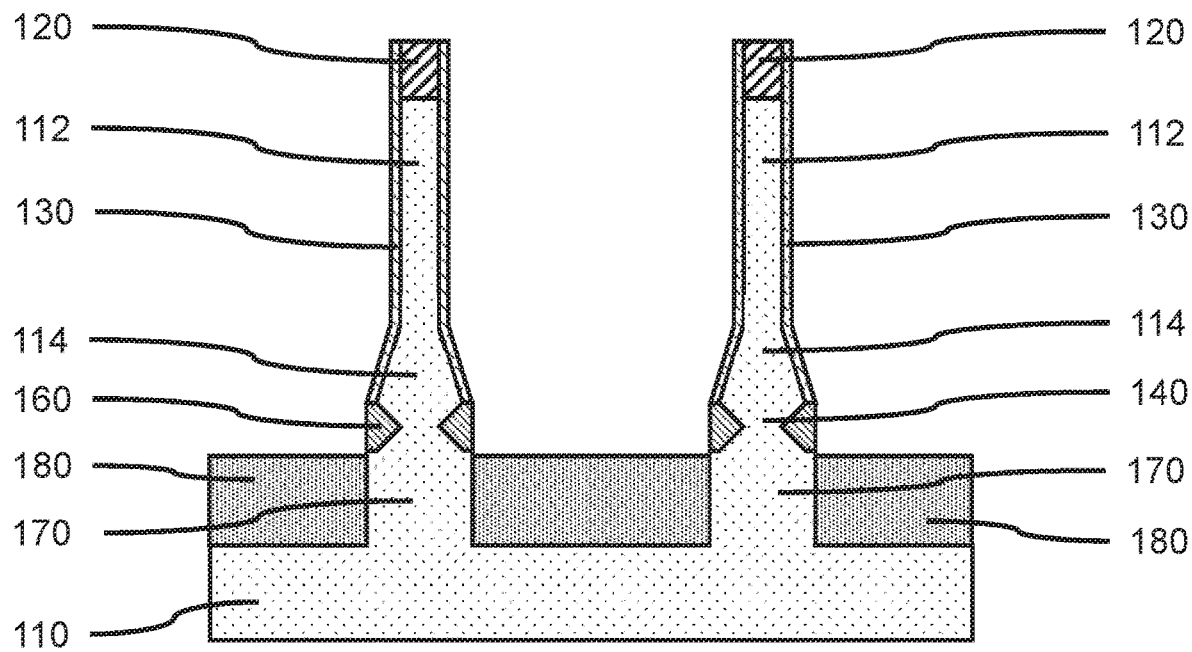
FIG. 7 is a cross-sectional side view showing a bottom source/drain layer formed on the substrate adjacent to the plinths, in accordance with an embodiment of the present invention.

FIG. 7 is a cross-sectional side view showing a bottom source/drain layer formed on the substrate adjacent to the plinths, in accordance with an embodiment of the present invention.

In one or more embodiments, a bottom source/drain layer 180 can be formed on the substrate 110 adjacent to the plinths 170. The bottom source/drain layer 180 can be formed by an epitaxial growth process, where growth can be selectively from the exposed surfaces of the substrate due to a greater growth rate. The bottom source/drain layer 180 can cover the substrate surfaces between the plinths 170. In various embodiments, the bottom source/drain layer 180 can have a dopant concentration in a range of about $5 \times 10^{20}$ cm$^{-3}$ to about $3 \times 10^{21}$ cm$^{-3}$, or about $1 \times 10^{21}$ cm$^{-3}$, although other dopant concentrations are also contemplated.

In various embodiments, the bottom source/drain layer 180 can be a semiconductor material, for example, silicon (Si), silicon-germanium (SiGe), silicon carbide (SiC), or a combination thereof. The bottom source/drain layer 180 can be formed by epitaxial growth with n-type or p-type dopants incorporated during the growth process (i.e., in situ), after the growth process (i.e., ex situ), or a combination thereof.

Figure 8:
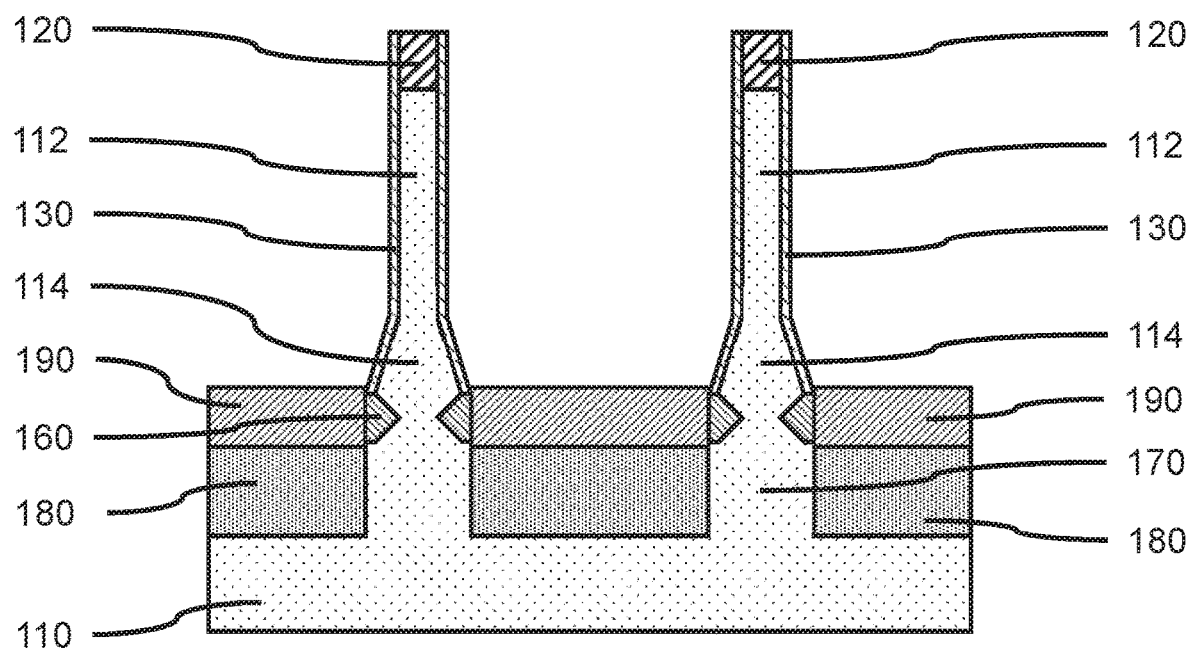
FIG. 8 is a cross-sectional side view showing a diffusion barrier layer formed on the bottom source/drain layer adjacent to the diffusion plugs, in accordance with an embodiment of the present invention.

FIG. 8 is a cross-sectional side view showing a diffusion barrier layer formed on the bottom source/drain layer adjacent to the diffusion plugs, in accordance with an embodiment of the present invention.

In one or more embodiments, a diffusion barrier layer 190 can be formed on the bottom source/drain layer 180, where the diffusion barrier layer 190 can be formed by epitaxial growth. The diffusion barrier layer 190 can be adjacent to the diffusion plugs 160.

In various embodiments, the diffusion barrier layer 190 can be made of silicon (Si) doped with phosphorus (P) and containing carbon (SiC:P) or silicon doped with arsenic and containing carbon (SiC:As) for stopping diffusion of n-type dopants. In various embodiments, the plug layer 150 can be made of silicon (Si) doped with boron (B) and containing carbon (SiC:B), high germanium concentration silicon-germanium doped with boron (SiGe:B) or silicon-germanium (SiGe) doped with boron (B) and containing carbon (SiGeC:B) for stopping diffusion of p-type dopants. The dopants can be introduced in situ (i.e., during epitaxial growth of the plug layer). In various embodiments, the carbon content of the layer can be in a range of about 1 atomic percent (at. %) to about 2 at. %, although other concentrations are also contemplated. In various embodiments, a high germanium concentration is a germanium concentration that is greater than the germanium concentration of the associated silicon-germanium source/drain. In various embodiments, a high germanium concentration is in a range of about 55 atomic percent (at. %) to about 75 at. %, or about 60 at. % to about 70 at. %, or about 65 at. %, although other concentrations are also contemplated.

Figure 9:
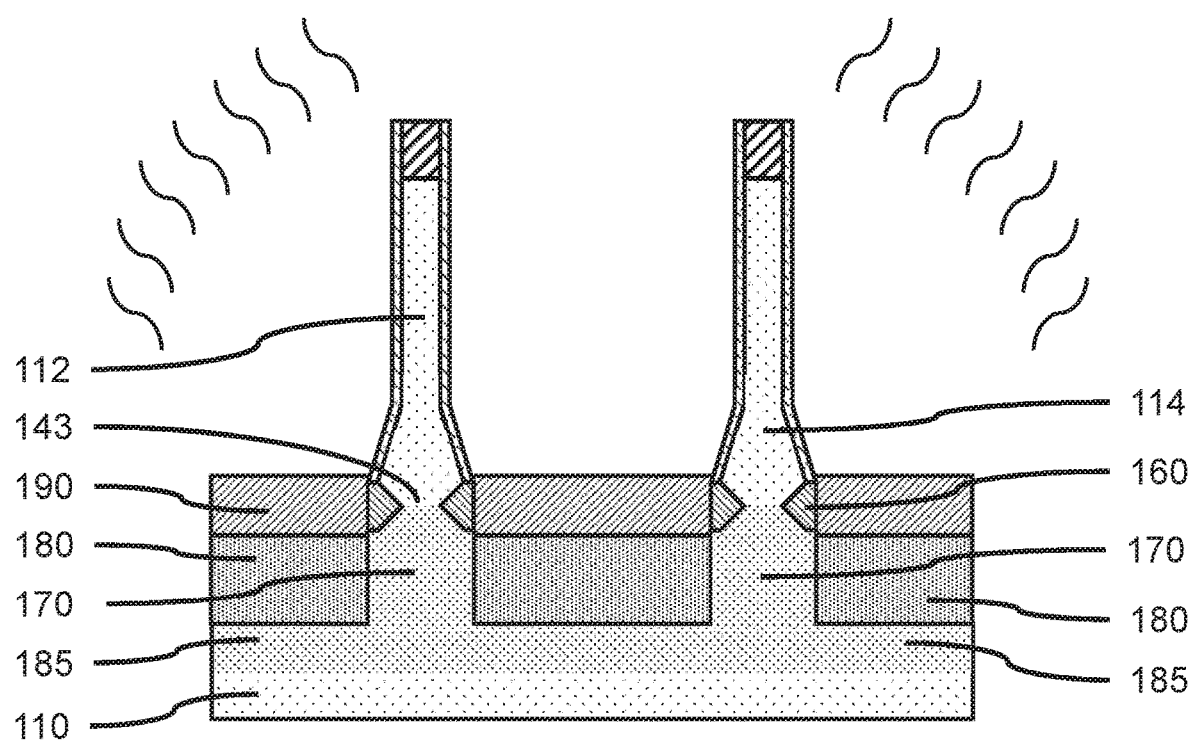
FIG. 9 is a cross-sectional side view showing a heat treatment of the diffusion barrier layer, diffusion plugs, and bottom source/drain layer to form extension regions in the plinths, in accordance with an embodiment of the present invention.

FIG. 9 is a cross-sectional side view showing a heat treatment of the diffusion barrier layer, diffusion plugs, and bottom source/drain layer to form extension regions in the plinths, in accordance with an embodiment of the present invention.

In one or more embodiments, the bottom source/drain layer 180, diffusion barrier layer 190, diffusion plugs 160, substrate 110, and vertical fins 112, can be heat treated to cause diffusion of dopants from the bottom source/drain layer 180 into the surrounding substrate 110, plinths 170, and support column 140 below the diffusion plugs 160 to form extension regions 185. The n-type or p-type dopant(s) from the bottom source/drain layer 180 can diffuse into the plinths 170 and support column 140 to the narrow necked region 143 to provide a timed diffusion profile. The extension region can extend up to a lower facet of the cavity 145 and diffusion plug 160. In various embodiments, the dopants can diffuse into the central portion of the plinths 170 and support column 140 from the heat treatment and diffusion, but remain below the necked region 143 due to the diffusion plugs 160 and diffusion profile.

In various embodiments, the extension regions 185 can have a dopant concentration in a range of about $1 \times 10^{18}$ cm$^{-3}$ to about $1 \times 10^{21}$ cm$^{-3}$, or about $1 \times 10^{19}$ cm$^{-3}$ to about $1 \times 10^{20}$ cm$^{-3}$, although other concentrations are also contemplated.

In various embodiments, the heat treatment can be a rapid thermal processing (RTP), rapid thermal annealing (RTA), laser annealing, and combinations thereof.

In various embodiments, the heat treatment can be conduct at a temperature in a range of about 700° C. to about 1100° C., or about 800° C. to about 1000° C., or about 900° C., for a duration in a range of about 0.1 seconds (sec) to about 30 sec, or about 1 sec to about 10 sec, or about 2 sec to about 5 sec, although other temperatures and durations are also contemplated.

Figure 10:
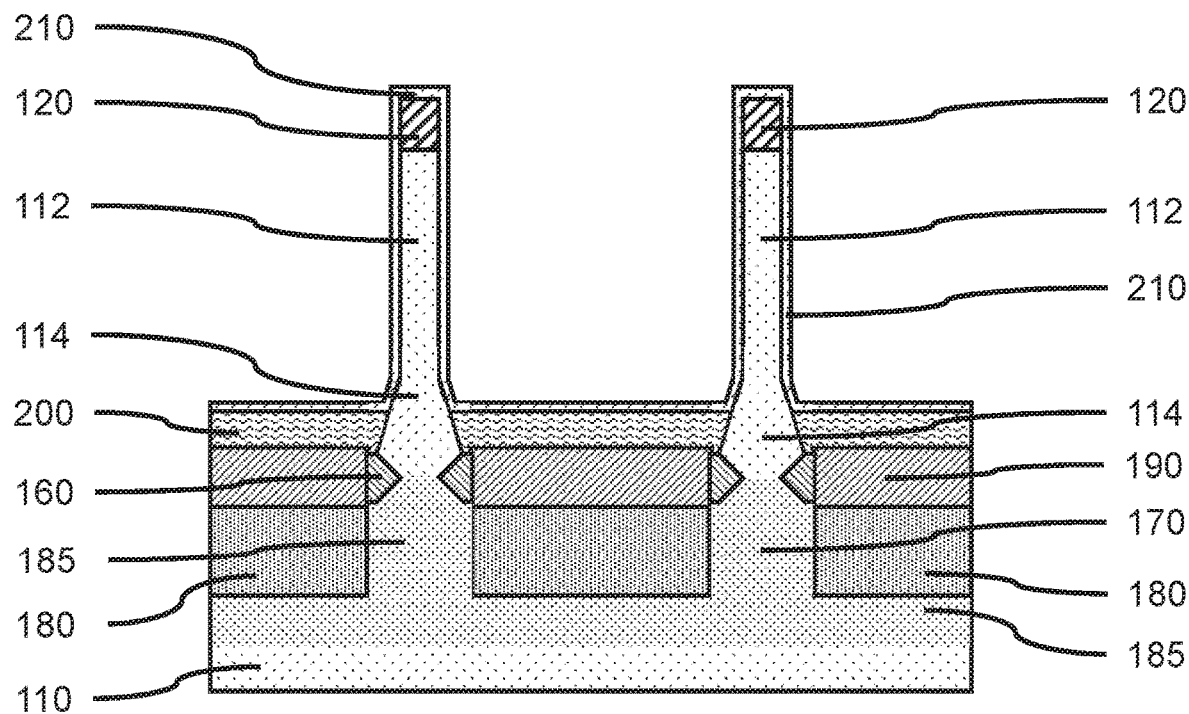
FIG. 10 is a cross-sectional side view showing a bottom spacer layer on the diffusion barrier layer and lower portion of the vertical fins, and a gate dielectric layer on the bottom spacer layer and vertical fins, in accordance with an embodiment of the present invention.

FIG. 10 is a cross-sectional side view showing a bottom spacer layer on the diffusion barrier layer and lower portion of the vertical fins, and a gate dielectric layer on the bottom spacer layer and vertical fins, in accordance with an embodiment of the present invention.

In one or more embodiments, the protective liner 130 can be removed to expose the underlying vertical fin surfaces. The protective liner 130 can be removed using a selective isotropic etch, for example, a wet chemical etch, dry plasma etch, or combination thereof. Removal of the protective liner 130 can expose the sidewalls of the vertical fin(s) 112 including the flared lower portion 114, and leave a hollow space or recess between the diffusion barrier layer 190 and flared lower portion 114.

In one or more embodiments, a bottom spacer layer 200 can be formed on the diffusion barrier layer 190 and at least a lower portion 114 of the vertical fins 112. The bottom spacer layer 200 can be formed by a directional deposition, for example, a gas cluster ion beam (GCIB) deposition, high density plasma (HDP) deposition, directional sputter deposition, or a combination thereof. An isotropic etch-back can be used to remove deposited material from the sidewalls of the vertical fins 112. The directional deposition can fill in the hollow space below the surface of the diffusion barrier layer 190.

In one or more embodiments, the bottom spacer layer 200 can be an electrically insulating dielectric material, including, but not limited to, silicon oxide (SiO), silicon nitride (SiN), silicon oxynitride (SiON), a low-k dielectric, or a combination thereof. The low-k dielectric materials can include, but not be limited to, silicon boro carbonitride (SiBCN), silicon boro nitride (SiBN), silicon carbonitride (SiCN), carbon-doped silicon oxide (SiO:C), fluorine doped silicon oxide (SiO:F), carbon-based polymeric materials (OPL), silicon based polymeric dielectric materials, for example, hydrogen silsesquioxane (HSQ) and methylsilsesquioxane (MSQ), tetraethoxysilane (TEOS), and combinations thereof.

In various embodiments, the bottom spacer layer 200 can have a thickness sufficient to cover the flared lower portion 114 of the vertical fins 112. In various embodiments, the bottom spacer layer 200 can have a thickness in a range of about 5 nm to about 15 nm, or about 7 nm to about 10 nm, or about 8 nm, although other thicknesses are also contemplated. The thickness of the bottom spacer layer 200 can be based on the height of the flared lower portion 114 of the vertical fin(s) 112.

In one or more embodiments, a gate dielectric layer 210 can be formed on the exposed surfaces of the fin templates 120, vertical fins 112, and bottom spacer layer 200, where the gate dielectric layer 170 can be formed by a conformal deposition (e.g., ALD, PEALD). In various embodiments, the gate dielectric layer 210 can cover an upper section of the angled surfaces of the flared lower portion 114, where the thickness of the bottom spacer layer 200 is less than the height of the flared lower portion 114. In various embodiments, the gate dielectric layer 210 does not extend to the angled surfaces of the flared lower portion 114, which is covered by the bottom spacer layer 200.

In various embodiments, the gate dielectric layer 210 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include, but are not limited to, metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 210 can have a thickness in a range of about 1 nm to about 3 nm, or about 2 nm, although other thicknesses are also contemplated.

Figure 11:
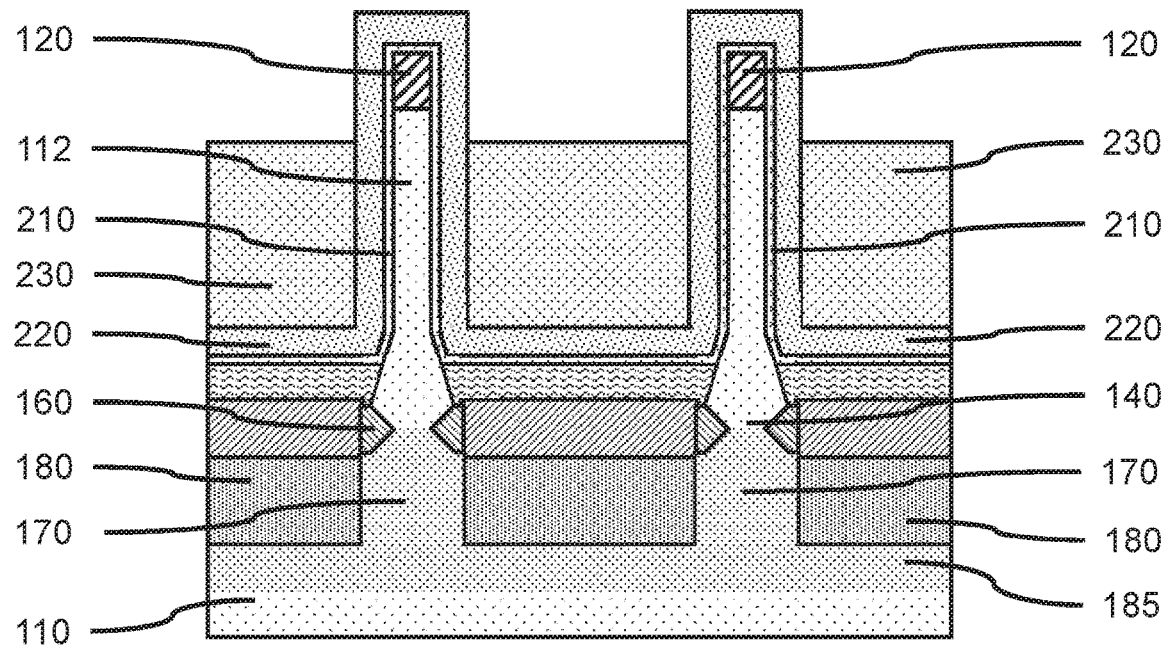
FIG. 11 is a cross-sectional side view showing a conductive gate layer on the gate dielectric layer, and a fill layer on the conductive gate layer, in accordance with an embodiment of the present invention.

FIG. 11 is a cross-sectional side view showing a conductive gate layer on the gate dielectric layer, and a fill layer on the conductive gate layer, in accordance with an embodiment of the present invention.

In one or more embodiments, a conductive gate layer 220 can be formed on the gate dielectric layer 210, where the conductive gate layer 220 can be formed by a conformal deposition (e.g., ALD, PEALD). The conductive gate layer 220 and gate dielectric layer 210 can form a gate structure on the vertical fin(s) 112 forming the fin channel of a VT FinFET.

In various embodiments, the conductive gate layer 220 can be a conducting material, including but not limited to, doped polycrystalline or amorphous silicon (p-Si, a-Si), germanium (p-Ge, a-Ge), silicon germanium (p-SiGe, a-SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotubes, conductive carbon, graphene, or any suitable combination of these materials.

In one or more embodiments, a fill layer 230 can be formed on the conductive gate layer 220, where the fill layer 230 can be formed by a blanket deposition, for example, chemical vapor deposition (CVD), plasma enhanced CVD (PECVD), physical vapor deposition (PVD), spin-on, or a combination thereof. The height of the fill layer 230 can be reduced using a directional etch, an isotropic etch, or a combination thereof, so the top surface of the fill layer is below the fin template 120 and top of the vertical fins 112. A portion of the conductive gate layer 220 can be exposed above the top surface of the fill layer 230.

In one or more embodiments, the fill layer 230 can be an electrically insulating dielectric material, including, but not limited to, silicon oxide (SiO), silicon nitride (SiN), silicon oxynitride (SiON), a low-k dielectric, or a combination thereof. The low-k dielectric materials can be carbon-doped silicon oxide (SiO:C), fluorine doped silicon oxide (SiO:F), carbon-based polymeric materials (OPL), silicon based polymeric dielectric materials, for example, hydrogen silsesquioxane (HSQ) and methylsilsesquioxane (MSQ), tetraethoxysilane (TEOS), and combinations thereof.

Figure 12:
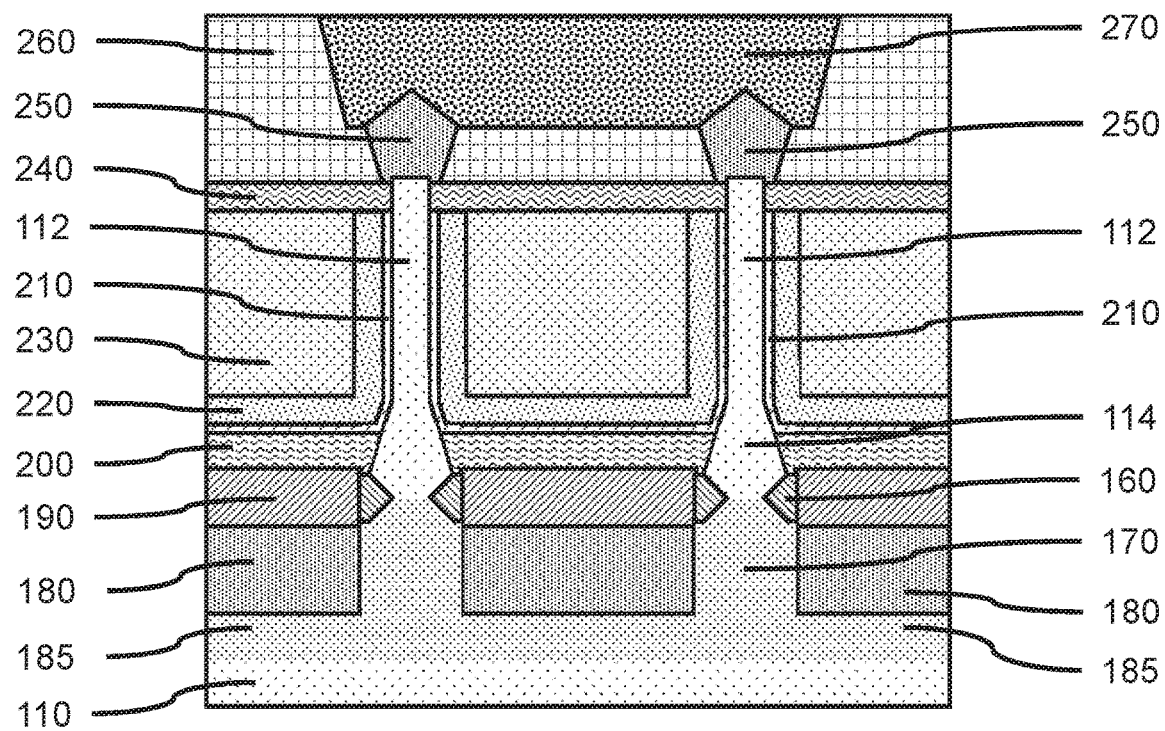
FIG. 12 is a cross-sectional side view showing a top spacer layer formed on the fill layer and conductive gate layer, top source/drains formed on the vertical fins, an interlayer dielectric (ILD) layer formed on the top spacer layer and top source/drains, and a source/drain contact formed in the ILD layer on the top source/drains to form a vertical fin field effect transistor device, in accordance with an embodiment of the present invention.

FIG. 12 is a cross-sectional side view showing a top spacer layer formed on the fill layer and conductive gate layer, top source/drains formed on the vertical fins, an interlayer dielectric (ILD) layer formed on the top spacer layer and top source/drains, and a source/drain contact formed in the ILD layer on the top source/drains to form a vertical fin field effect transistor device, in accordance with an embodiment of the present invention.

In one or more embodiments, the portions of the conductive gate layer 220 exposed above the top surface of the fill layer 230 can be removed to expose upper portions of the gate dielectric layer 210 using a selective etch. The exposed upper portions of the gate dielectric layer 210 can be removed to expose an upper portion of the underlying vertical fin(s) 112 and fin template(s) 120.

In one or more embodiments, a top spacer layer 240 can be formed on the fill layer 230, conductive gate layer, and gate dielectric layer 210, where the top spacer layer 240 can be formed by a directional deposition (e.g., GCIB, HDP, etc.) and isotropic etch-back. The top spacer layer 240 can cover a portion of the sidewalls of the vertical fin(s) 112.

In one or more embodiments, the top spacer layer 240 can be an electrically insulating dielectric material, including, but not limited to, silicon oxide (SiO), silicon nitride (SiN), silicon oxynitride (SiON), a low-k dielectric, or a combination thereof. The low-k dielectric materials can be carbon-doped silicon oxide (SiO:C), fluorine doped silicon oxide (SiO:F), carbon-based polymeric materials (OPL), silicon based polymeric dielectric materials, for example, hydrogen silsesquioxane (HSQ) and methylsilsesquioxane (MSQ), tetraethoxysilane (TEOS), and combinations thereof.

In one or more embodiments, top source/drains 250 can be formed on the exposed upper surfaces of the vertical fins 112, where the top source/drains 250 can be formed by an epitaxtal growth process. The top source/drains 250 can be incorporate the same dopant as the bottom source/drain layer 180 underlying the same vertical fin 112. In various embodiments, different n-type or p-type dopants can be incorporated into the top source/drains 250 and bottom source/drain layer 180 of different vertical fins 112 to form a complementary metal-oxide-semiconductor (CMOS) device on the substrate 110. In various embodiments, multiple vertical fins can be electrically coupled to form a single VT FinFET device.

In one or more embodiments, an interlayer dielectric (ILD) layer 260 can be formed on the top source/drains 250 and top spacer layer 240, where the ILD layer can be formed by a blanket deposition.

In one or more embodiments, the interlayer dielectric (ILD) layer 260 can be an electrically insulating dielectric material, including, but not limited to, silicon oxide (SiO), silicon nitride (SiN), silicon oxynitride (SiON), a low-k dielectric, or a combination thereof.

In one or more embodiments, a source/drain contact 270 can be formed in the ILD layer 260, where the source/drain contact 270 can be formed using lithographic processes, etching, deposition(s), and planarization methods, for example, chemical-mechanical polishing (CMP). In various embodiments, the source/drain contact 270 can span two or more top source/drains 250 to form a CMOS device or electrically coupled fin channels of a VT FinFET.

In various embodiments, the source/drain contact 270 can be made of a conductive material, including, but not limited to, tungsten (W), aluminum (Al), copper (Cu), cobalt (Co), nickel (Ni), titanium (Ti), ruthenium (Ru), molybdenum (Mo), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of a metal contact material with the top source drain material, and/or other ILD layer material.

Figure 13:
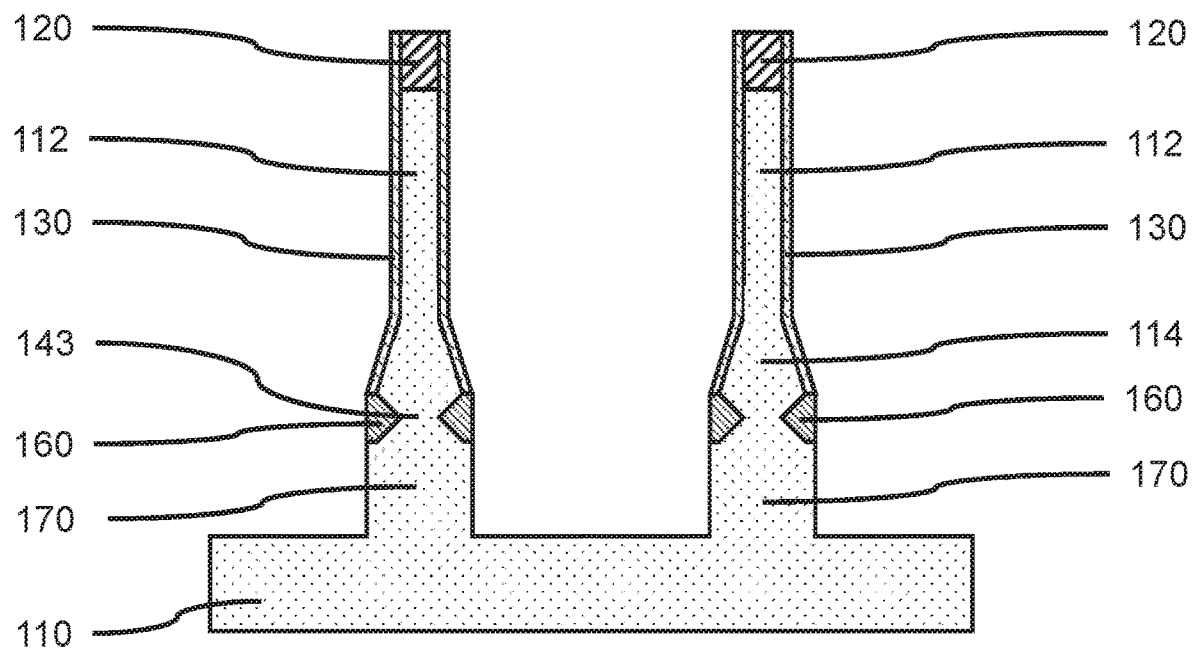
FIG. 13 is a cross-sectional side view showing exposed portions of the plug layer removed to form diffusion plugs in the cavities, and a plinth below each support column, in accordance with another embodiment of the present invention.

FIG. 13 is a cross-sectional side view showing exposed portions of the plug layer removed to form diffusion plugs in the cavities, and a plinth below each support column, in accordance with another embodiment of the present invention.

In one or more embodiments, the fabrication process can vary starting after the formation of the diffusion plugs 160 and plinth(s) 170.

Figure 14:
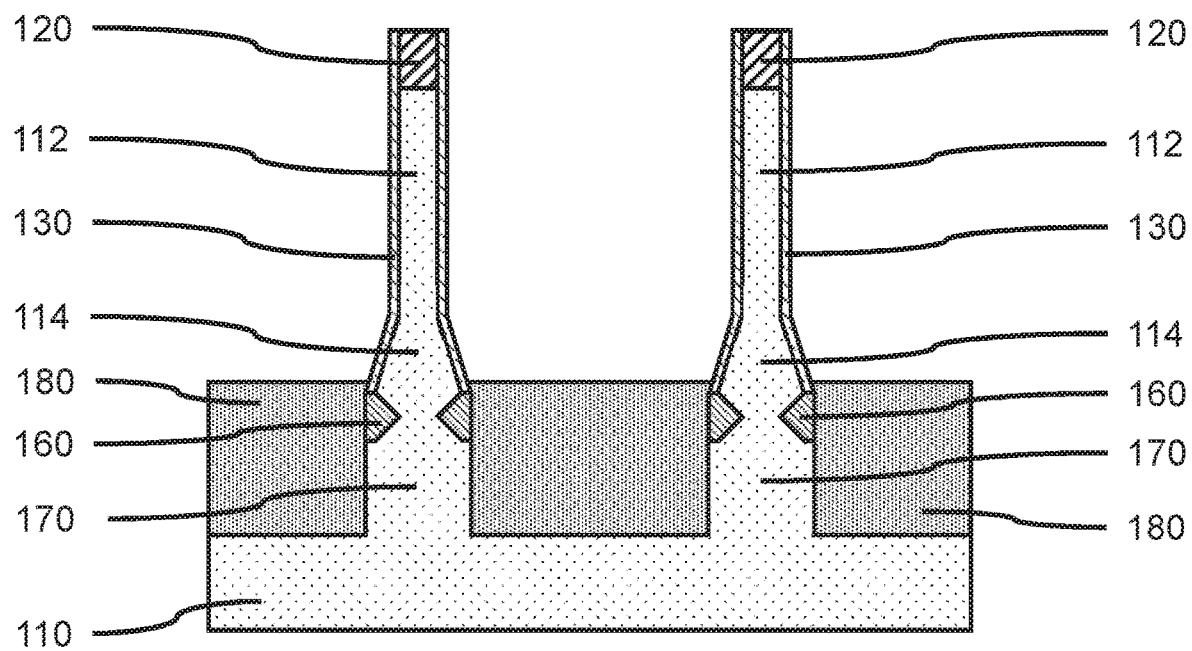
FIG. 14 is a cross-sectional side view showing a bottom source/drain layer formed on the substrate adjacent to the plinths and diffusion plugs, in accordance with another embodiment of the present invention.

FIG. 14 is a cross-sectional side view showing a bottom source/drain layer formed on the substrate adjacent to the plinths and diffusion plugs, in accordance with another embodiment of the present invention.

In one or more embodiments, a bottom source/drain layer 180 can be formed on the substrate 110 adjacent to the plinths 170 and diffusion plugs 160, where the top surface of the bottom source/drain layer 180 can be approximately coplanar or above the top(s) of the diffusion plugs 160. In various embodiments, the bottom source/drain layer 180 can cover a lower edge of the protective liner 130 on the flared lower portion 114 of the vertical fin(s) 112. In various embodiments, the bottom source/drain layer 180 can be formed by epitaxial growth from the surface of the substrate 110.

Figure 15:
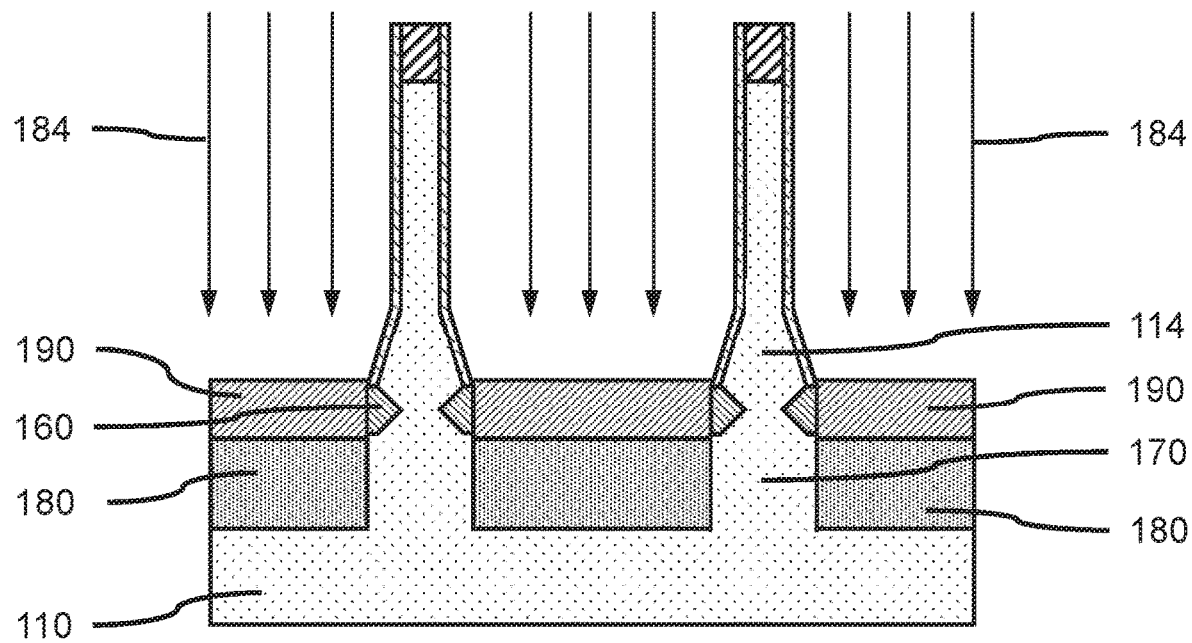
FIG. 15 is a cross-sectional side view showing chemical agent implantation into the upper portions of the bottom source/drain layer to form a diffusion barrier layer adjacent to the diffusion plugs, in accordance with another embodiment of the present invention.

FIG. 15 is a cross-sectional side view showing chemical agent implantation into the upper portions of the bottom source/drain layer to form a diffusion barrier layer adjacent to the diffusion plugs, in accordance with another embodiment of the present invention.

In one or more embodiments, a chemical agent 184 can be introduced into an upper portion of the bottom source/drain layer 180 to form a diffusion barrier layer 190, where the chemical agent 184 can be introduced by ion implantation, plasma implantation, liquid phase diffusion, solid phase diffusion, or combinations thereof.

In various embodiments, the chemical agent 184 can be carbon (C), an n-type dopant (e.g., phosphorus (P)), a p-type dopant (e.g., boron (B)), or a combination thereof. The bottom source/drain layer 180 can be, for example, silicon (Si), silicon-germanium (SiGe), silicon carbide (SiC), or a combination thereof. In various embodiments, the diffusion barrier layer 190 can be made of silicon (Si) doped with boron (B) and containing carbon (SiCB), high germanium concentration silicon-germanium doped with boron (SiGe:B) or silicon-germanium (SiGe) doped with phosphorus (B) and containing carbon (SiGeCB) for stopping diffusion of p-type dopants. In various embodiments, the carbon content of the layer can be in a range of about 1 at. % to about 2 at. %, although other concentrations are also contemplated.

Figure 16:
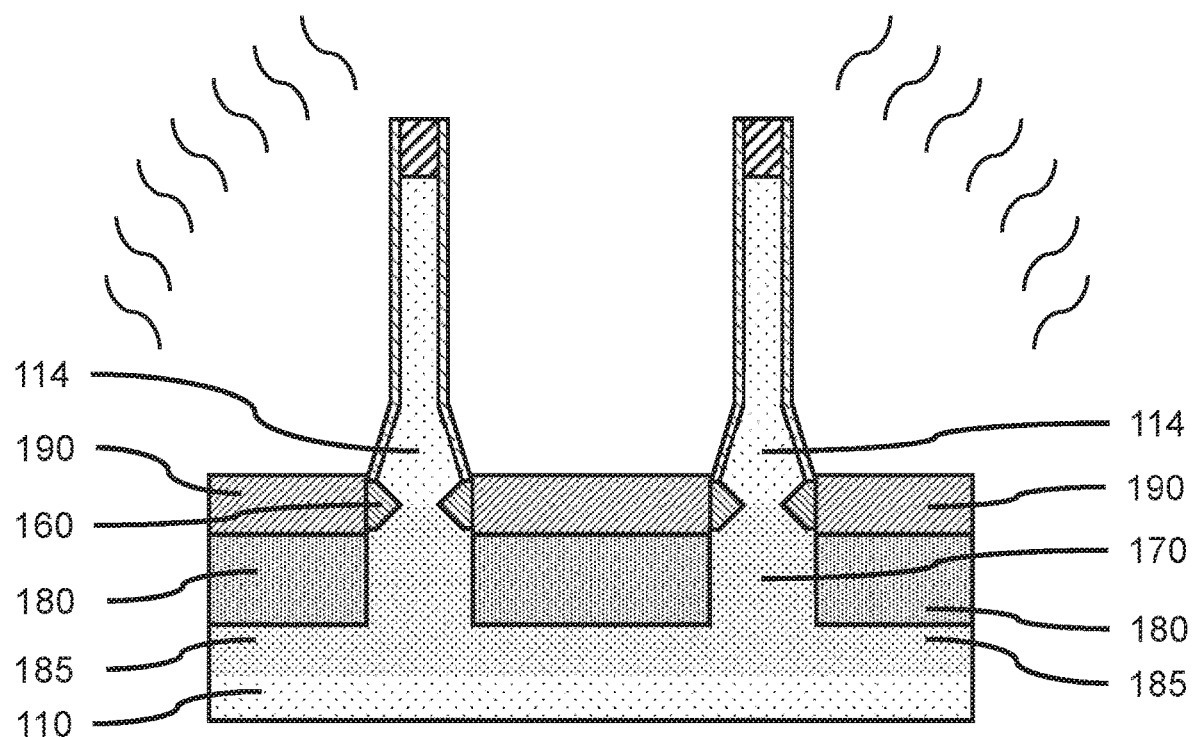
FIG. 16 is a cross-sectional side view showing a heat treatment of the diffusion barrier layer, diffusion plugs, and bottom source/drain layer to form extension regions in the plinths, in accordance with another embodiment of the present invention.

FIG. 16 is a cross-sectional side view showing a heat treatment of the diffusion barrier layer, diffusion plugs, and bottom source/drain layer to form extension regions in the plinths, in accordance with another embodiment of the present invention.

In one or more embodiments, the bottom source/drain layer 180, diffusion barrier layer 190, diffusion plugs 160, substrate 110, and vertical fins 112, can be heat treated to cause diffusion of dopants from the bottom source/drain layer 180 into the surrounding substrate 110, plinths 170, and support column 140 below the diffusion plugs 160 to form extension regions 185. The n-type or p-type dopant(s) from the bottom source/drain layer 180 can diffuse into the plinths 170 and support column 140 to the narrow necked region 143 to provide a timed diffusion profile. The extension region can extend up to a lower facet of the cavity 145 and diffusion plug 160. A central portion of the plinths 170 and support column 140 can remain essentially free of dopants from the heat treatment and diffusion.

Figure 17:
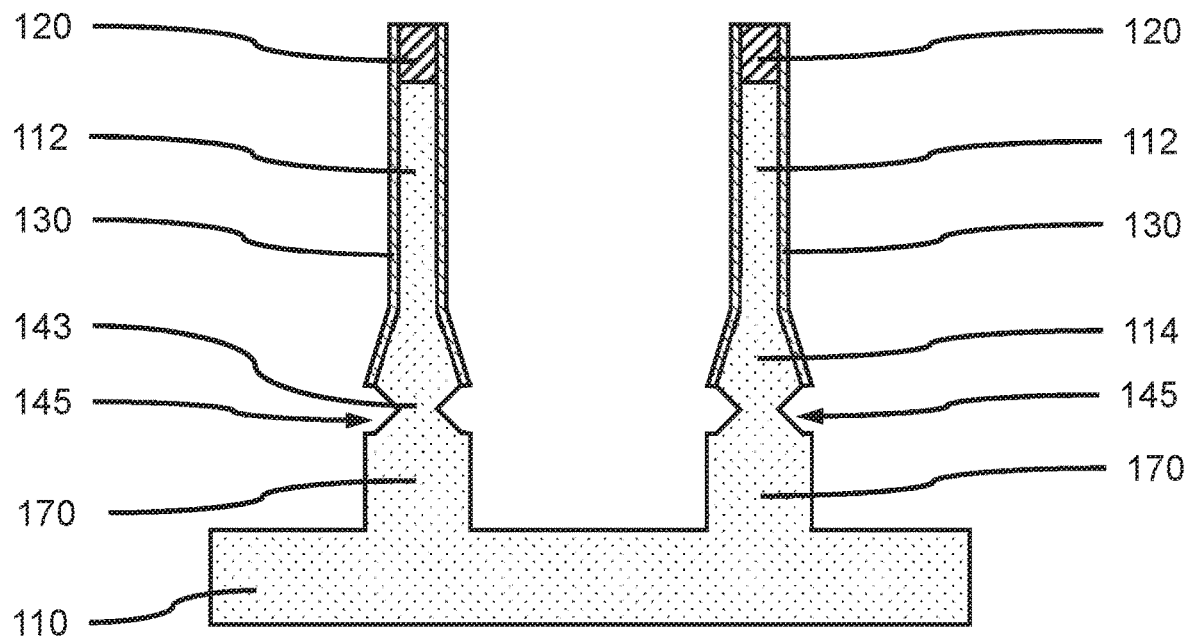
FIG. 17 is a cross-sectional side view showing cavities formed in each support column, and a plinth formed beneath each support column, in accordance with yet another embodiment of the present invention.

FIG. 17 is a cross-sectional side view showing cavities formed in each support column, and a plinth formed beneath each support column, in accordance with yet another embodiment of the present invention.

In yet another embodiment, the cavities 145 can be formed in the support column(s) 140 using a crystal plane selective etch, and the plinths 170 can be formed by directional etching (e.g., RIE) before forming the diffusion plugs 160 in cavities 145, where the selective directional etch (e.g., RIE) can use the fin templates 120 and protective liner 130 on the vertical fins 112 as a mask.

Figure 18:
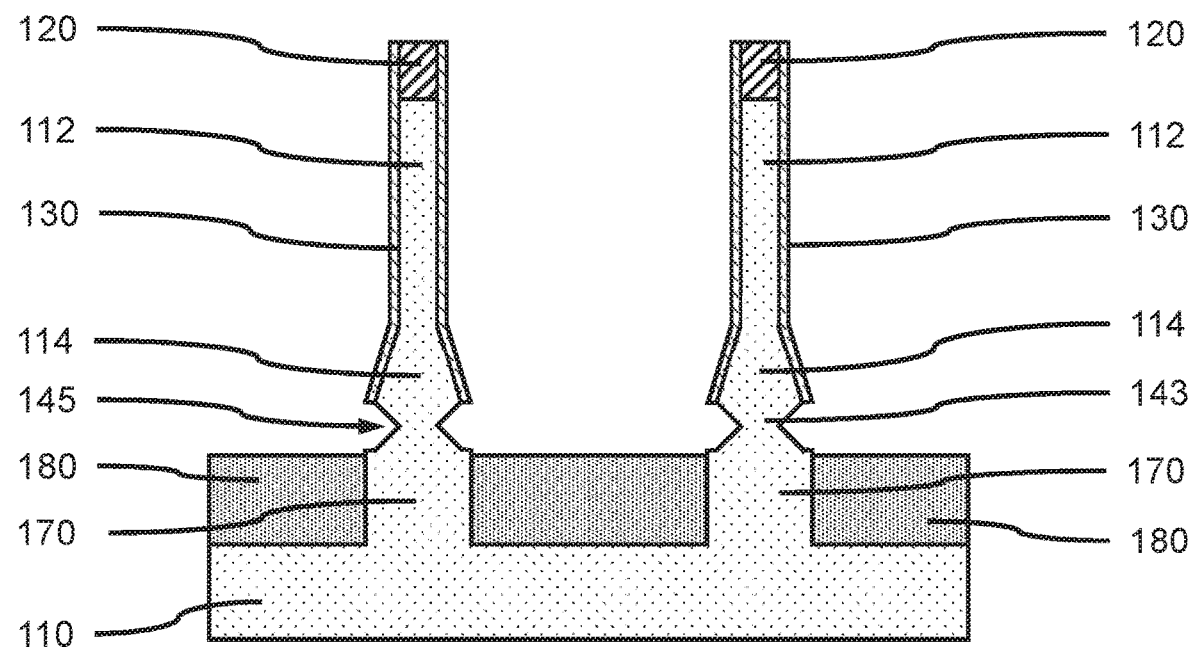
FIG. 18 is a cross-sectional side view showing a bottom source/drain layer formed on the substrate adjacent to the plinths, in accordance with yet another embodiment of the present invention.

FIG. 18 is a cross-sectional side view showing a bottom source/drain layer formed on the substrate adjacent to the plinths, in accordance with yet another embodiment of the present invention.

In one or more embodiments, a bottom source/drain layer 180 can be formed on the substrate, where the top surface of the bottom source/drain layer 180 is below the bottom edge of the cavities 145, such that the cavities are open. The bottom source/drain layer 180 can be formed by epitaxial growth and doping.

Figure 19:
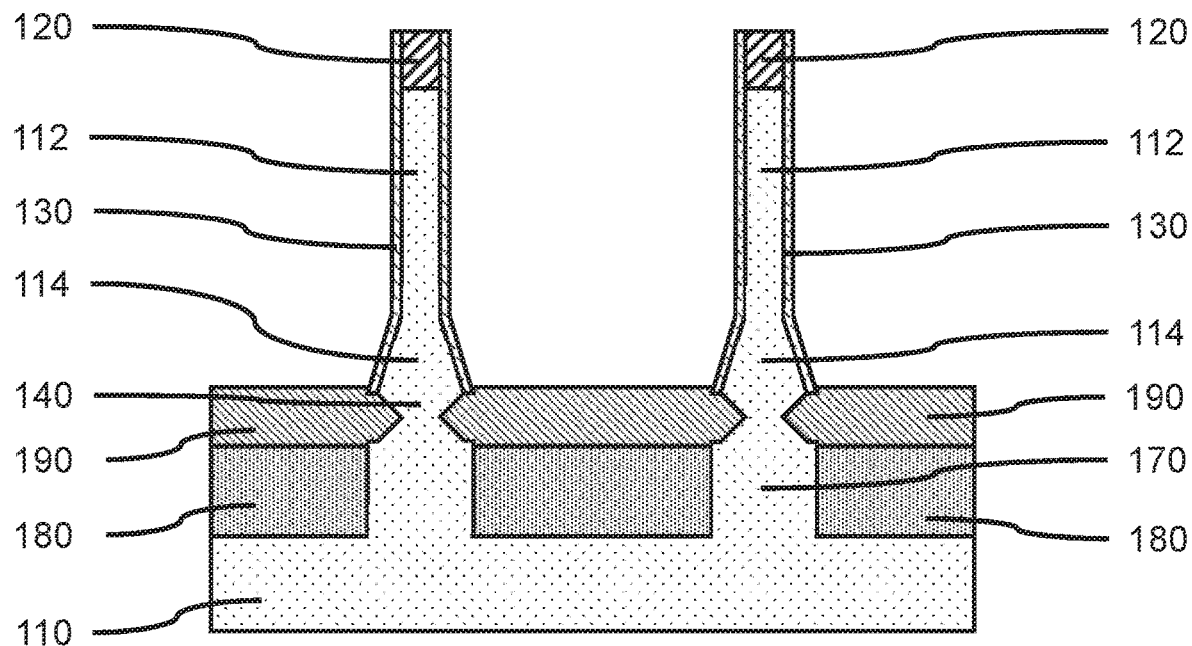
FIG. 19 is a cross-sectional side view showing a diffusion barrier layer formed on the bottom source/drain layer and in the cavities, in accordance with an embodiment of the present invention.

FIG. 19 is a cross-sectional side view showing a diffusion barrier layer formed on the bottom source/drain layer and in the cavities, in accordance with an embodiment of the present invention.

In one or more embodiments, a diffusion barrier layer 190 can be formed on the bottom source/drain layer 180 and in the cavities 145 in the support column(s) 140, where the diffusion barrier layer 190 can be formed by an epitaxial growth process, where epitaxy can be from the crystal faces of the cavities 145 and/or the surface of the bottom source/drain layer 180. The diffusion barrier layer 190 can fill in the cavities 145 in place of the diffusion plugs 160.

In various embodiments, the diffusion plug 160, as shown for example in FIGS. 6 and 13, is a diffusion barrier material formed in the cavity 145 of the support column 140, whereas the diffusion barrier layer 190 is a diffusion barrier material formed on top of the bottom source drain to prevent upward diffusion of dopants, as shown for example in FIGS. 8 and 15. In various embodiments, the diffusion barrier layer 190 can replace the diffusion plug 160 in the cavity 145, as shown in FIG. 19, where the diffusion barrier layer 190 can reduce or prevent both upward diffusion of dopants from the bottom source/drain layer 180 and upward diffusion of dopants in the support column(s) 140. In other embodiments, both a diffusion plug 160 and diffusion barrier layer 190 are present to reduce or prevent diffusion, where the diffusion plugs 160 can reduce or prevent upward diffusion of dopants from the bottom source/drain layer 180 in the support column(s) 140.

Figure 20:
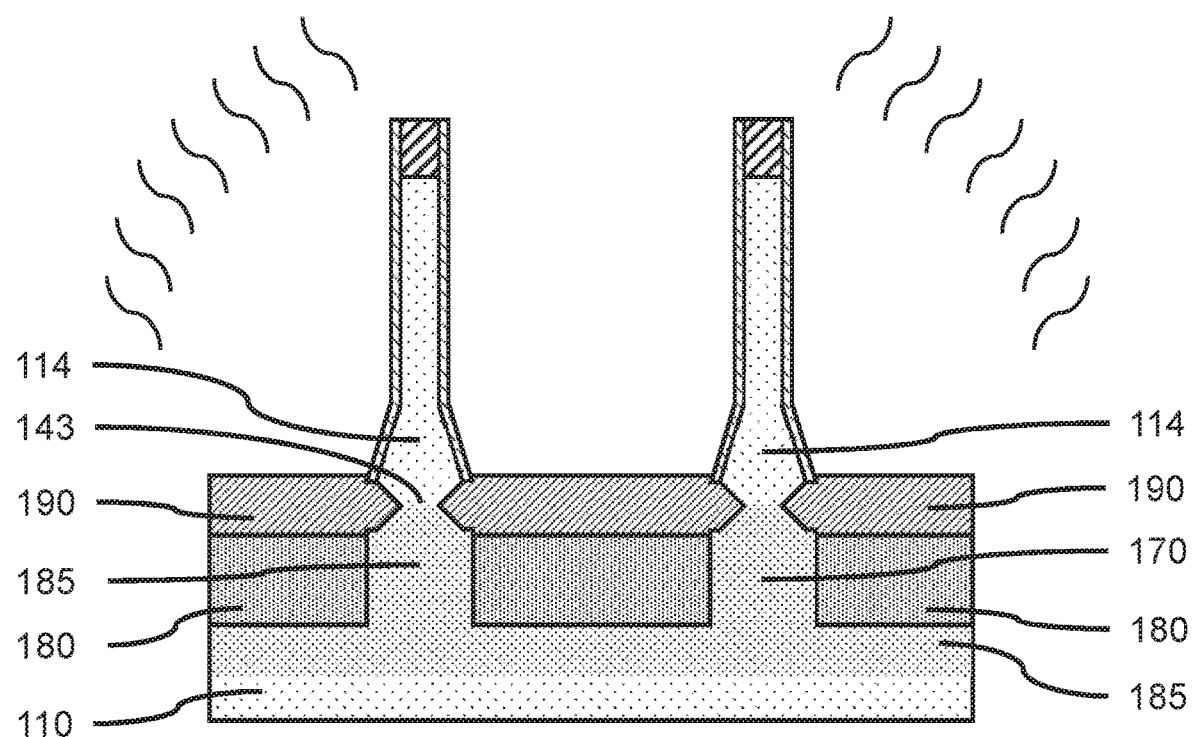
FIG. 20 is a cross-sectional side view showing a heat treatment of the diffusion barrier layer and bottom source/drain layer to form extension regions in the plinths and substrate, in accordance with an embodiment of the present invention.

FIG. 20 is a cross-sectional side view showing a heat treatment of the diffusion barrier layer and bottom source/drain layer to form extension regions in the plinths and substrate, in accordance with an embodiment of the present invention.

In one or more embodiments, the bottom source/drain layer 180, diffusion barrier layer 190, substrate 110, and vertical fins 112, can be heat treated to cause diffusion of dopants from the bottom source/drain layer 180 into the surrounding substrate 110, plinths 170, and support column 140 below the cavity to form extension regions 185. The n-type or p-type dopant(s) from the bottom source/drain layer 180 can diffuse into the plinths 170 and support column 140 to the narrow necked region 143 to provide a timed diffusion profile. The extension region can extend up to a lower facet of the cavity 145 and diffusion barrier layer 190 in the cavity 145. In various embodiments, the dopants can diffuse into the central portion of the plinths 170 and support column 140 from the heat treatment and diffusion, but remain below the necked region 143 due to the diffusion plugs 160 and diffusion profile.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B)

only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an ion of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transport fin field effect transistor device, comprising:
   one or more vertical fins a substrate, wherein each of the one or more vertical fins has a lower flared portion;
   a support column beneath the lower flared portion of at least one of the one or more vertical fins;
   a cavity in the support column of the at least one of the one or more vertical fins, wherein the cavity forms a narrowed neck region;
   a plinth beneath the support column of the at least one of the one or more vertical fins;
   a bottom source/drain layer on the substrate adjacent to the plinth;
   an extension region in the plinth and the support column that extends up to a lower facet of the cavity; and
   a diffusion barrier layer on the bottom source/drain layer.

2. The device of claim 1, further comprising a diffusion plug in the cavity.

3. The device of claim 2, wherein the diffusion plug is made of a diffusion barrier material selected from the group consisting of silicon (Si) doped with phosphorus (P) and containing carbon (SiCP), silicon doped with arsenic and containing carbon (SiC:As), silicon (Si) doped with boron (B) and containing carbon (SiC:B), silicon-germanium doped with boron (SiGe:B), silicon-germanium (SiGe) doped with boron (B) and containing carbon (SiGeC:B), and combinations thereof.

4. The device of claim 1, wherein the diffusion barrier layer fills in the cavity in the support column.

5. The device of claim 4, wherein the diffusion barrier layer is made of a diffusion barrier material selected from the group consisting of silicon (Si) doped with phosphorus (P) and containing carbon (SiCP), silicon doped with arsenic (Si:As), silicon (Si) doped with boron (B) and containing carbon (SiCB), silicon-germanium doped with boron (SiGe:B), silicon-germanium (SiGe) doped with phosphorus (B) and containing carbon (SiGeCB), and combinations thereof.

6. The device of claim 1, further comprising a bottom spacer layer on the diffusion barrier layer, a gate structure on the bottom spacer layer, and a top source/drain the at least one of the one or more vertical fins.

7. A vertical transport fin field effect transistor device, comprising:
   one or more vertical fins on a substrate, wherein each of the one or more vertical fins has an upper channel portion and a lower flared portion having a width greater than the upper channel portion;
   a support column beneath the lower flared portion of at least one of the one or more vertical fins;
   a cavity in the support column of the at least one of the one or more vertical fins, wherein the cavity forms a narrowed neck region;
   a plinth beneath the support column of the at least one of the one or more vertical fins;
   a bottom source/drain layer on the substrate adjacent to the plinth;
   an extension region in the plinth and the support column that extends up to a lower facet of the cavity; and
   a diffusion plug in the cavity.

8. The device of claim 7, wherein the diffusion plug is made of a diffusion barrier material selected from the group consisting of silicon (Si) doped with phosphorus (P) and containing carbon (SiCP), silicon doped with arsenic and containing carbon (SiC:As), silicon (Si) doped with boron (B) and containing carbon (SiC:B), silicon-germanium doped with boron (SiGe:B), silicon-germanium (Site) doped with boron (B) and containing carbon (SiGeC:B), and combinations thereof.

9. The device of claim 8, further comprising a gate dielectric layer on at least a portion of the lower flared portion.

10. The device of claim 9, further comprising a diffusion barrier layer on the bottom source/drain layer.

11. The device of claim 10, further comprising a bottom spacer layer on the diffusion barrier layer, wherein a portion of the gate dielectric layer is on the bottom spacer layer.

12. The device of claim 11, further comprising a top source/drain on at least one of the one or more vertical fins.

13. The device of claim 12, wherein the plinth has a width about equal to the width of the support column.

14. The device of claim 13, wherein the extension region has a dopant concentration in a range of about $1\times10^{18}$ cm$^{-3}$ to about $1\times10^{21}$ cm$^{-3}$.

15. A vertical transport fin field effect transistor device, comprising:
one or more vertical fins on a substrate, wherein each of the one or more vertical fins has an upper channel portion and a lower flared portion having a width greater than the upper channel portion;
a support column beneath the lower flared portion of at least one of the one or more vertical fins;
a cavity in the support column of the at least one of the one or more vertical fins, wherein the cavity forms a narrowed neck region;
a plinth beneath the support column of the at least one of the one or more vertical fins;
a bottom source/drain layer on the substrate adjacent to the plinth;
a diffusion plug in the cavity; and
a diffusion barrier layer on the bottom source/drain layer.

16. The device of claim 15, further comprising a bottom spacer layer on the diffusion barrier layer.

17. The device of claim 16, wherein the diffusion plug is made of a diffusion barrier material selected from the group consisting of silicon (Si) doped with phosphorus (P) and containing carbon (SiCP), silicon doped with arsenic and containing carbon (SiCAs), silicon (Si) doped with boron (B) and containing carbon (SiC:B), silicon-germanium doped with boron (SiGe:B), silicon-germanium (SiGe) doped with boron (B) and containing carbon (SiGeC:B), and combinations thereof.

18. The device of claim 17, further comprising a gate dielectric layer on at least a portion of the lower flared portion and the bottom spacer layer.

19. The device of claim 17, further comprising an extension region in the plinth and the support column that extends up to the narrowed neck region.

* * * * *